(12) United States Patent
Tsao et al.

(10) Patent No.: US 9,601,501 B2
(45) Date of Patent: Mar. 21, 2017

(54) NONVOLATILE MEMORY CELL STRUCTURE WITH ASSISTANT GATE AND MEMORY ARRAY THEREOF

(71) Applicant: eMemory Technology Inc., Hsin-Chu (TW)

(72) Inventors: Mu-Ying Tsao, Changhua County (TW); Wei-Ren Chen, Pingtung County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/155,087

(22) Filed: May 16, 2016

(65) Prior Publication Data

US 2016/0260727 A1     Sep. 8, 2016

Related U.S. Application Data

(63) Continuation-in-part of application No. 14/675,758, filed on Apr. 1, 2015, now Pat. No. 9,368,161.

(Continued)

(51) Int. Cl.
*H01L 29/167* (2006.01)
*H01L 29/207* (2006.01)
(Continued)

(52) U.S. Cl.
CPC .... *H01L 27/11524* (2013.01); *G11C 16/0425* (2013.01); *G11C 17/16* (2013.01); *G11C 17/18* (2013.01); *H01L 23/528* (2013.01); *H01L 27/11206* (2013.01); *H01L 29/0649* (2013.01); *H01L 29/42328* (2013.01); *H01L 29/42368* (2013.01); *H01L 29/4916* (2013.01); *H01L 29/512* (2013.01); *H01L 29/7817* (2013.01); *H01L 29/7835* (2013.01); *H01L 23/5252* (2013.01); *H01L 29/93* (2013.01); *H01L 2924/0002* (2013.01)

(58) Field of Classification Search
CPC ............. H01L 21/8238; H01L 21/8229; H01L 21/242; H01L 21/762; H01L 21/043; H01L 21/0257; H01L 21/048; H01L 21/041; H01L 27/0251; H01L 27/1104; H01L 29/106; H01L 29/7816; H01L 29/66045
USPC .. 257/68, 243, 296, 288, 576, 607, E21.008, 257/42, 45, 51, 126, 127, 412, 435, 632, 257/645, 662, 668, 681, 682
See application file for complete search history.

(56) References Cited

U.S. PATENT DOCUMENTS 5,912,842 A    6/1999  Chang
5,966,329 A   10/1999  Hsu
(Continued)

*Primary Examiner* — David Nhu
(74) *Attorney, Agent, or Firm* — Winston Hsu; Scott Margo

(57) ABSTRACT

An NVM array includes a plurality of NVM cells, a plurality of word lines extending along a first direction, a plurality of bit lines extending along a second direction, and a plurality of source lines. Each of the NVM cells includes a PMOS select transistor and a PMOS floating gate transistor serially connected to the PMOS select transistor. Each word line is electrically connected to the select gate of the PMOS select transistor. Each bit line is electrically connected to a doping region of the PMOS floating gate transistor of each of the plurality of NVM cells. Each source line is electrically connected to a doping region of the PMOS select transistor.

14 Claims, 12 Drawing Sheets

Related U.S. Application Data

(60) Provisional application No. 61/973,867, filed on Apr. 2, 2014.

(51) Int. Cl.

| | | |
|---|---|---|
| *H01L 29/227* | (2006.01) | |
| *H01L 31/0288* | (2006.01) | |
| *H01L 27/115* | (2006.01) | |
| *H01L 29/06* | (2006.01) | |
| *H01L 29/423* | (2006.01) | |
| *H01L 29/49* | (2006.01) | |
| *H01L 23/528* | (2006.01) | |
| *G11C 16/04* | (2006.01) | |
| *G11C 17/16* | (2006.01) | |
| *G11C 17/18* | (2006.01) | |
| *H01L 29/51* | (2006.01) | |
| *H01L 29/78* | (2006.01) | |
| *H01L 27/112* | (2006.01) | |
| *H01L 23/525* | (2006.01) | |
| *H01L 29/93* | (2006.01) | |

(56) References Cited

U.S. PATENT DOCUMENTS

| | | | |
|---|---|---|---|
| 6,914,825 B2 | 7/2005 | Hsu | |
| 8,344,443 B2 | 1/2013 | Chen | |
| 9,041,089 B2 | 5/2015 | Chen | |
| 9,324,381 B2 * | 4/2016 | Wu | G11C 5/06 |
| 9,368,161 B2 * | 6/2016 | Tsao | G11C 5/06 |
| 2014/0183612 A1 | 7/2014 | Chen | |
| 2014/0361358 A1 | 12/2014 | Chen | |
| 2015/0091073 A1 | 4/2015 | Li | |
| 2016/0013199 A1 * | 1/2016 | Hsu | H01L 27/11524 257/316 |

\* cited by examiner

| | $V_{SL}$ | $V_{BL}$ | $V_{NW}$ | $V_{WL}$ | $V_{EL}$ | $V_{PW}$ | Mode |
|---|---|---|---|---|---|---|---|
| PGM | $V_{PP}$ | 0V | $V_{PP}$ | $V_{DD}$ | $V_{DD}$ | 0V | CHEI |
| ERS | 0V | 0V | 0V | 0V | $V_{EE}$ | 0V | FN |
| READ | $V_{DD}$ | 0V | $V_{DD}$ | 0V | 0V | 0V | |

NONVOLATILE MEMORY CELL STRUCTURE WITH ASSISTANT GATE AND MEMORY ARRAY THEREOF

CROSS REFERENCE TO RELATED APPLICATIONS

This application is a CIP of Ser. No. 14/675,758 filed Apr. 1, 2015, U.S. Pat. No. 9,368,161 B2 which claims the benefit of U.S. provisional application No. 61/973,867 filed Apr. 2, 2014. The above-mentioned applications are included in their entirety herein by reference.

BACKGROUND OF THE INVENTION

Field of the Invention

The present invention relates generally to the field of nonvolatile memory (NVM) devices. More particularly, the present invention relates to a single-poly NVM cell structure with an assistant gate (AG) and NVM array thereof.

Description of the Prior Art

Non-volatile memory devices, such as EEPROM and flash memory, are widely used in electronic devices to store data that can be electrically erased and reprogrammed and that must be saved when power is removed. Generally, NVM devices may be divided into multi-time programmable (MTP) memory and one-time programmable (OTP) memory. MTP memory is multi-readable and multi-writable. For example, EEPROM and flash memory are designedly equipped with some corresponding electric circuits to support different operations such as programming, erasing and reading. OTP functions perfectly with electric circuits with mere programming and reading functions. Electric circuits for erasing operation are not required in OTP.

Single-poly NVM designs have been proposed which reduce the additional processing cost. A single-poly NVM forms the charge-storage floating gate with a single layer of polysilicon. Because the single-poly NVM is compatible with regular CMOS process, it is applied in the field of embedded memory, embedded nonvolatile memory in the mixed-mode circuits and micro-controllers (such as System on Chip, SOC), for example.

It is known that programming of memory cell can be accomplished by hot electron injection techniques (also known as channel hot electron or CHE programming). Leakage current during programming and verification operations is exacerbated as the core device length is reduced. Moreover, as flash memory devices are scaled down and the channel length of the memory cells is reduced, program disturbs of adjacent devices also increase. Program disturb may occur in adjacent memory cells that share the same word line as the memory cell being programmed. Further, as dimensions and tunneling oxide of the memory cell unit continue to shrink, the data retention loss or charge leakage from the floating gate looms as an increasingly serious problem. Therefore, there is a strong need in this industry to improve the data retention or endurance characteristics of the NVM cell structure.

SUMMARY OF THE INVENTION

It is one objective of the invention to provide an improved single-poly NVM cell structure with an assistant gate and NVM array thereof, which are capable of achieving higher endurance, larger ON/OFF window, reducing program current (by about 20%) and/or program voltage, and alleviating program disturbs.

According to one embodiment of the invention, a nonvolatile memory (NVM) array is disclosed. The NVM array includes a plurality of NVM cells. Each of the NVM cells includes a semiconductor substrate having therein an N well; a first oxide define (OD) region and a second oxide define (OD) region disposed within the semiconductor substrate; a PMOS select transistor disposed on the first OD region, wherein the PMOS select transistor comprises a select gate, a first $P^+$ source doping region in the N well, and a second $P^+$ doping region spaced apart from the first $P^+$ source doping region; a PMOS floating gate transistor serially connected to the PMOS select transistor and being disposed over the first OD region, wherein the PMOS floating gate transistor comprises a floating gate overlying the first OD region, the second $P^+$ doping region, and a third $P^+$ doping region spaced apart from the second $P^+$ source doping region, wherein the PMOS floating gate transistor serves as a charge storage element of the NVM cell; and an assistant gate protruding from the floating gate to one edge of the second OD region such that is a coupling capacitor between the assistant gate and the second OD region, wherein the assistant gate is formed integrally with the floating gate using a single layer of polysilicon.

The NVM array further includes a plurality of word lines extending along a first direction. Each of the word lines is electrically connected to the select gate of the PMOS select transistor of each of the plurality of NVM cells.

The NVM array further includes a plurality of bit lines extending along a second direction. Each of the bit lines is electrically connected to the third $P^+$ doping region of the PMOS floating gate transistor of each of the plurality of NVM cells.

The NVM array further includes a plurality of source lines. Each of the source lines is electrically connected to the first $P^+$ doping region of the PMOS select transistor of each of the plurality of NVM cells.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings:

FIGS. 5 and 6 illustrate the equivalent circuit and exemplary operation conditions for programming (PGM), reading (READ) or erasing (ERS) operations of the memory cell unit as set forth in FIG. 1;

Figure 1:
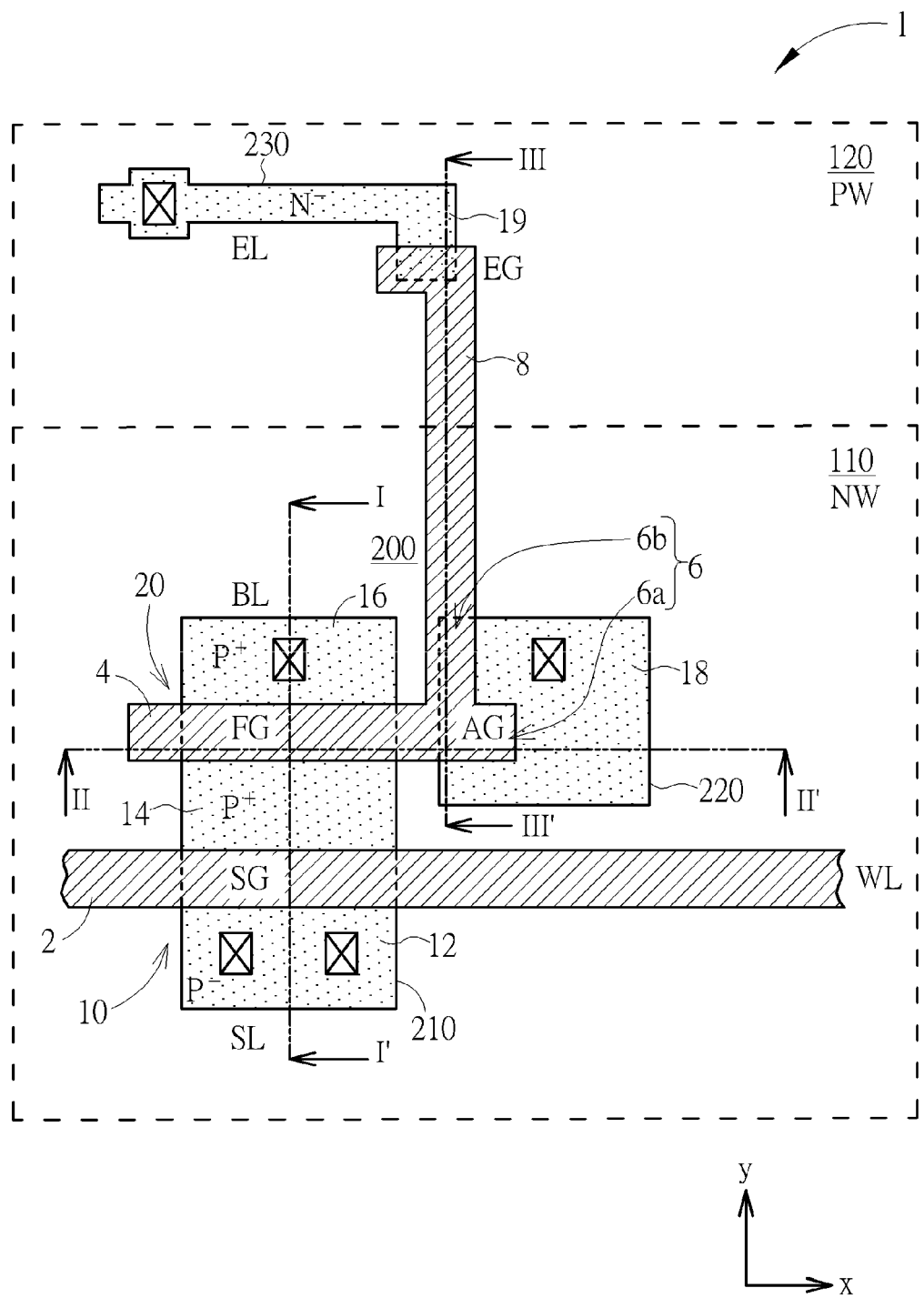
FIG. 1 is a schematic plan view of a layout of a single-poly, nonvolatile memory cell unit in accordance with one embodiment of this invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some system configurations and process steps are not disclosed in detail, as these should be well-known to those skilled in the art. Other embodiments may be utilized and structural, logical, and electrical changes may be made without departing from the scope of the present invention.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

The term "oxide define (OD) region" ("OD" region is sometimes referred to as "oxide defined" region or "oxide definition" region) is commonly known in this technical field to be defined as a region on a silicon main surface of a substrate other than a local oxidation of silicon (LOCOS) or a shallow trench isolation (STI) region. The term "oxide define (OD) region" is also commonly referred to as an "active area" where the active circuit elements such as transistors are formed and operated.

Figure 2:
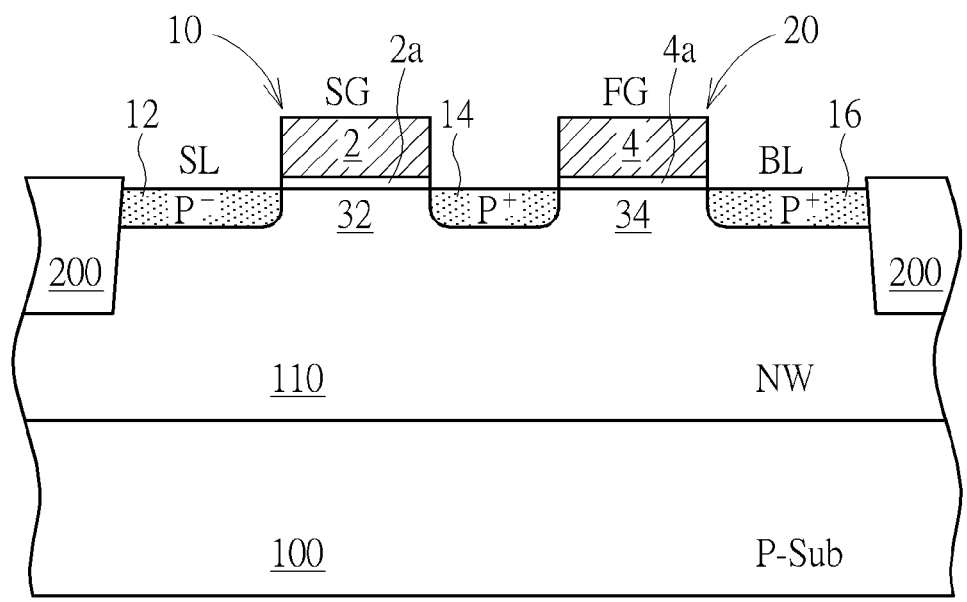
FIG. 2 is a schematic, cross-sectional diagram taken along line I-I' of FIG. 1.
Figure 3:
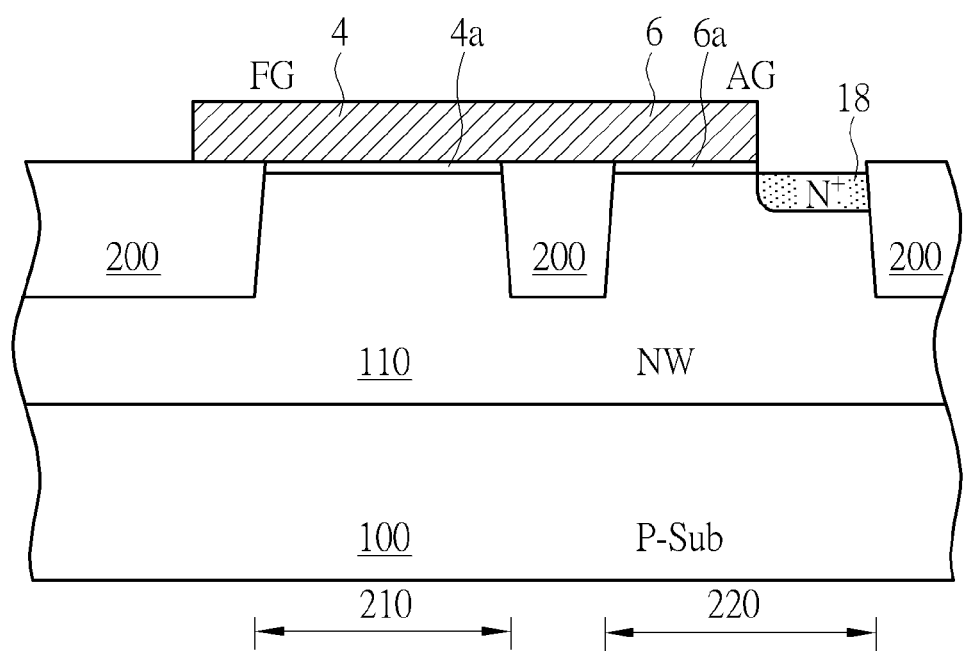
FIG. 3 is a schematic, cross-sectional diagram taken along line II-II' of FIG. 1.
Figure 4:
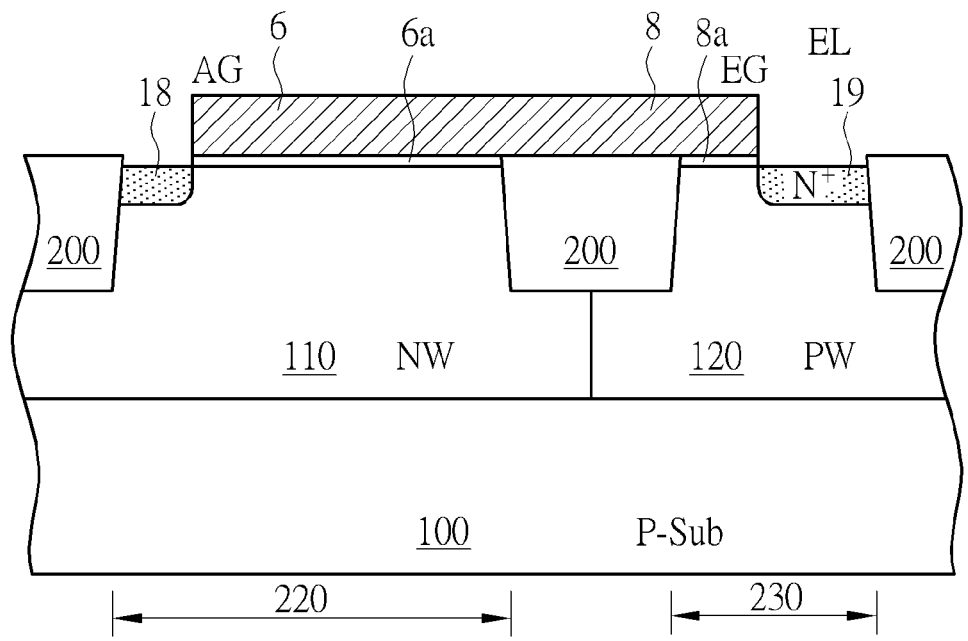
FIG. 4 is a schematic, cross-sectional diagram taken along line III-III' of FIG. 1.

FIGS. 1-4 are schematic diagrams demonstrating a single-poly NVM cell structure in accordance with one embodiment of this invention. FIG. 1 is a schematic plan view of a layout of a single-poly, nonvolatile memory cell unit in accordance with one embodiment of this invention. FIG. 2 is a schematic, cross-sectional diagram taken along line I-I' of FIG. 1. FIG. 3 is a schematic, cross-sectional diagram taken along line II-II' of FIG. 1. FIG. 4 is a schematic, cross-sectional diagram taken along line III-III' of FIG. 1. The demonstrated NVM cell structure may function as a multi-time programmable (MTP) memory unit. It is to be understood that the present invention may be applicable to other memory devices.

As shown in FIG. 1, the NVM cell 1 comprises three spaced-apart oxide define (OD) regions arranged in close proximity to one another. The three spaced-apart OD regions includes a first OD region 210, a second OD region 220, and a third OD region 230, which are isolated from one another by an isolation region 200 that is embedded in a main surface of a semiconductor substrate 100 such as a P type doped silicon substrate (P-Sub). According to the illustrative embodiment, the isolation region 200 may be a shallow trench isolation (STI) region, but should not be limited thereto. It is to be understood that the layout in FIG. 1 is for illustrative purposes only.

According to the illustrative embodiment, the first OD region 210 and the second OD region 220 are formed within an N well (NW) 110, while the third OD region 230 is formed within a P well (PW) 120.

As can be seen in FIG. 1 and FIG. 2, the NVM cell 1 comprises a select transistor 10 and a floating gate transistor 20 serially connected to the select transistor 10. The serially connected select transistor 10 and the floating gate transistor 20 may be formed directly on the first OD region 210. According to the illustrative embodiment, the select transistor 10 may be a PMOS transistor and comprises a $P^+$ source doping region 12 (coupled to a source line SL) in the N well 110, a common $P^+$ doping region 14 spaced apart from the $P^+$ source doping region 12, a select gate channel region 32 near the main surface of the semiconductor substrate 100 between the $P^+$ source doping region 12 and the common $P^+$ doping region 14, a select gate (SG) 2 coupled to a word line (WL) overlying the select gate channel region 32, and a gate dielectric layer 2a between the select gate 2 and the select gate channel region 32. Sidewall spacers (not shown) may be formed on opposite sidewalls of the select gate 2.

The floating gate transistor 20 is formed directly on the first OD region 210. The floating gate transistor 20 is coupled to the select transistor 10 through the common $P^+$ doping region 14. The common $P^+$ doping region 14 is shared by the floating gate transistor 20 and the select transistor 10, thereby forming two serially connected transistors, and in this case, two serially connected PMOS transistors.

The floating gate transistor 20 comprises a floating gate (FG) 4 overlying the first OD region 210. According to the illustrative embodiment, the floating gate 4 consists of a single layer of polysilicon, for example, $N^+$ doped polysilicon or $P^+$ doped polysilicon. According to the illustrative embodiment, the floating gate transistor 20 serves as the charge storage element of the NVM cell 1. According to the illustrative embodiment, both of the select gate 2 and the floating gate 4 are straight line-shaped and extend along a first direction (reference x-axis).

The floating gate transistor 20 further comprises the common $P^+$ doping region 14 on one side of the floating gate (FG) 4, a $P^+$ drain doping region 16 on the other side of the floating gate 4, a floating gate channel region 34 between the common $P^+$ doping region 14 and the $P^+$ drain doping region 16 (coupled to a bit line BL), and a gate dielectric layer 4a between the floating gate 4 and the floating gate channel region 34. According to the illustrative embodiment, the gate dielectric layer 4a has a thickness that is substantially equal to that of the gate dielectric layer 2a. According to the illustrative embodiment, the select transistor 10 and the floating gate transistor 20 share the same N well 110.

As can be seen in FIG. 1 and FIG. 3, according to the illustrative embodiment, the NVM cell 1 further comprises an assistant gate (AG) 6 that protrudes from one distal end of the floating gate 4 to one edge of the second OD region 220 such that the assistant gate (AG) 6 is capacitively coupled to the second OD region 220 and the N well 110. When viewed from above, the assistant gate (AG) 6 partially overlaps with the second OD region 220 and partially overlaps with the edge that directly faces the first OD region 210.

An $N^+$ doping region 18 may be formed within an area of the second OD region 220 not covered by the assistant gate (AG) 6. The $N^+$ doping region 18 functions as N well pick-up contact may be provided on the second OD region 220 to provide the N well 110 with an N well voltage ($V_{NW}$). According to the illustrative embodiment, no additional doping region or ion well is required between the assistant gate 6 and the N well 110. According to the illustrative embodiment, an induced voltage coupled from the assistant gate (AG) 6 is controlled by the N well voltage ($V_{NW}$). The induced voltage generated because of the coupling effect between the assistant gate (AG) 6 and the biased N well will increase more carriers tunneling to the floating gate during the program operation so that the program efficiency of the memory cell is improved. According to the illustrative embodiment, the assistant gate (AG) 6 may be composed of $N^+$ doped polysilicon or $P^+$ doped polysilicon.

According to the illustrative embodiment, the assistant gate (AG) 6 may comprise a horizontal segment 6a that extends continuously from the floating gate (FG) 4 along the first direction (reference x-axis) and is directly connected to the floating gate (FG) 4. According to the illustrative embodiment, the assistant gate (AG) 6 may further comprise a vertical segment 6b that extends along a second direction (reference y-axis) and is directly connected to the horizontal segment 6a.

According to the illustrative embodiment, the assistant gate (AG) 6 is formed integrally with the floating gate 4 using the same fabrication processes. According to the illustrative embodiment, the assistant gate (AG) 6 can be self-biasing from the N well voltage ($V_{NW}$). Moreover, it is able to increase coupling ratio and program efficiency. Furthermore, the assistant gate (AG) 6 is able to reduce program disturbs and program current/voltage. Furthermore, the NVM cell 1 is able to suppress off-state current as well as $I_{OFF}$ rising issue, so as to achieve higher endurance and larger ON/OFF window. The assistant gate (AG) 6 offers the floating gate transistor 20 capability to compensate coupling ratio and hence controls the channel better.

As can be seen in FIG. 1 and FIG. 4, according to the illustrative embodiment, the NVM cell 1 may further comprise an erase gate (EG) 8 that extends continuously from the vertical segment 6b along the second direction (reference y-axis) and traverses the junction between the N well 110 and the P well 120. According to the illustrative embodiment, one distal end of the erase gate (EG) 8 overlaps with the third OD region 230 that is formed within the P well 120. By providing such configuration, the erase gate (EG) 8 is capacitively coupled to the third OD region 230 and the P well 120. An $N^+$ doping region 19 may be formed within an area of the third OD region 230 not covered by the erase gate (EG) 8.

Figure 5:
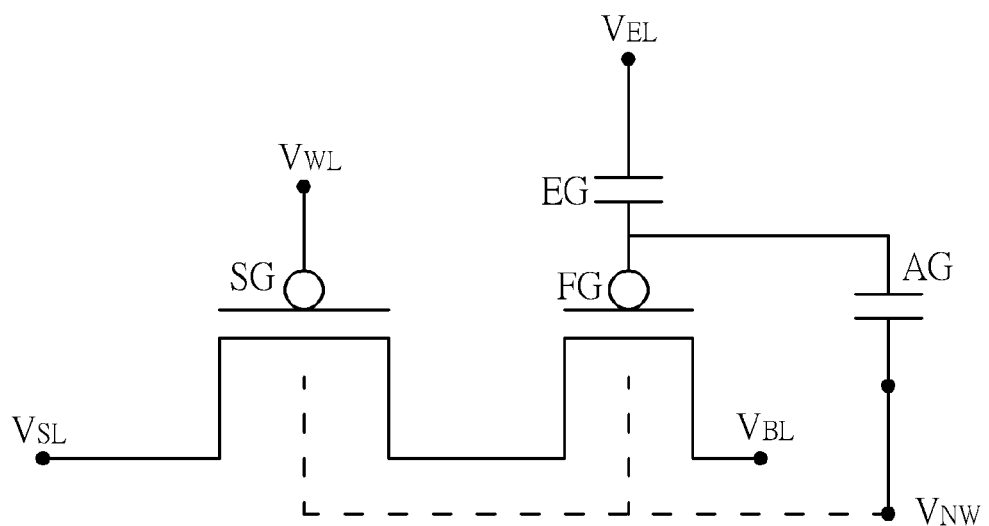

FIGS. 5 and 6 illustrate the equivalent circuit and exemplary operation conditions for programming (PGM), reading (READ) or erasing (ERS) operations of the memory cell unit as set forth in FIG. 1. As shown in FIGS. 5 and 6, during PGM operation, the select gate (SG) is coupled to a word line voltage $V_{WL}=V_{DD}$. The erase line (EL) is coupled to an erase line voltage $V_{EL}=V_{DD}$. The source line (SL) is coupled to a source line voltage $V_{SL}=V_{PP}$. The bit line (BL) is grounded ($V_{BL}=0V$). The N well (NW) 110 is coupled to an N well voltage $V_{NW}=V_{PP}$. The P well (PW) 120 is coupled to a P well voltage $V_{PW}=0V$. According to the illustrative embodiment, $V_{PP}$ and $V_{EE}$ may range between 2V and 15V. According to the illustrative embodiment, $V_{DD}$ may range between 2V and 10V. Under the aforesaid conditions, the NVM cell 1 may be programmed by channel hot electron injection (CHEI) mechanism.

During erasing (ERS) operation, the select gate (SG) is coupled to a word line voltage $V_{WL}=0V$. The erase line (EL) is coupled to an erase line voltage $V_{EL}=V_{EE}$. The source line (SL) is coupled to a source line voltage $V_{SL}=0V$. The bit line (BL) is grounded ($V_{BL}=0V$). The N well (NW) 110 is coupled to an N well voltage $V_{NW}=0V$. The P well (PW) 120 is coupled to a P well voltage $V_{PW}=0V$. According to the illustrative embodiment, $V_{PP}$ and $V_{EE}$ may range between 2V and 15V. According to the illustrative embodiment, $V_{DD}$ may range between 2V and 10V. Under the aforesaid conditions, the NVM cell 1 may be erased by Fowler Nordheim (FN) mechanism.

During READ operation, the select gate (SG) is coupled to a select gate voltage $V_{WL}=0V$. The erase line (EL) is coupled to an erase line voltage $V_{EL}=0V$. The source line (SL) is coupled to a source line voltage $V_{SL}=V_{DD}$. The bit line (BL) is grounded ($V_{BL}=0V$). The N well (NW) 110 is coupled to an N well voltage $V_{NW}=V_{DD}$. The P well (PW) 120 is coupled to a P well voltage $V_{PW}=0V$. According to the illustrative embodiment, $V_{PP}$ and $V_{EE}$ may range between 2V and 15V. According to the illustrative embodiment, $V_{DD}$ may range between 2V and 10V.

Figure 7:
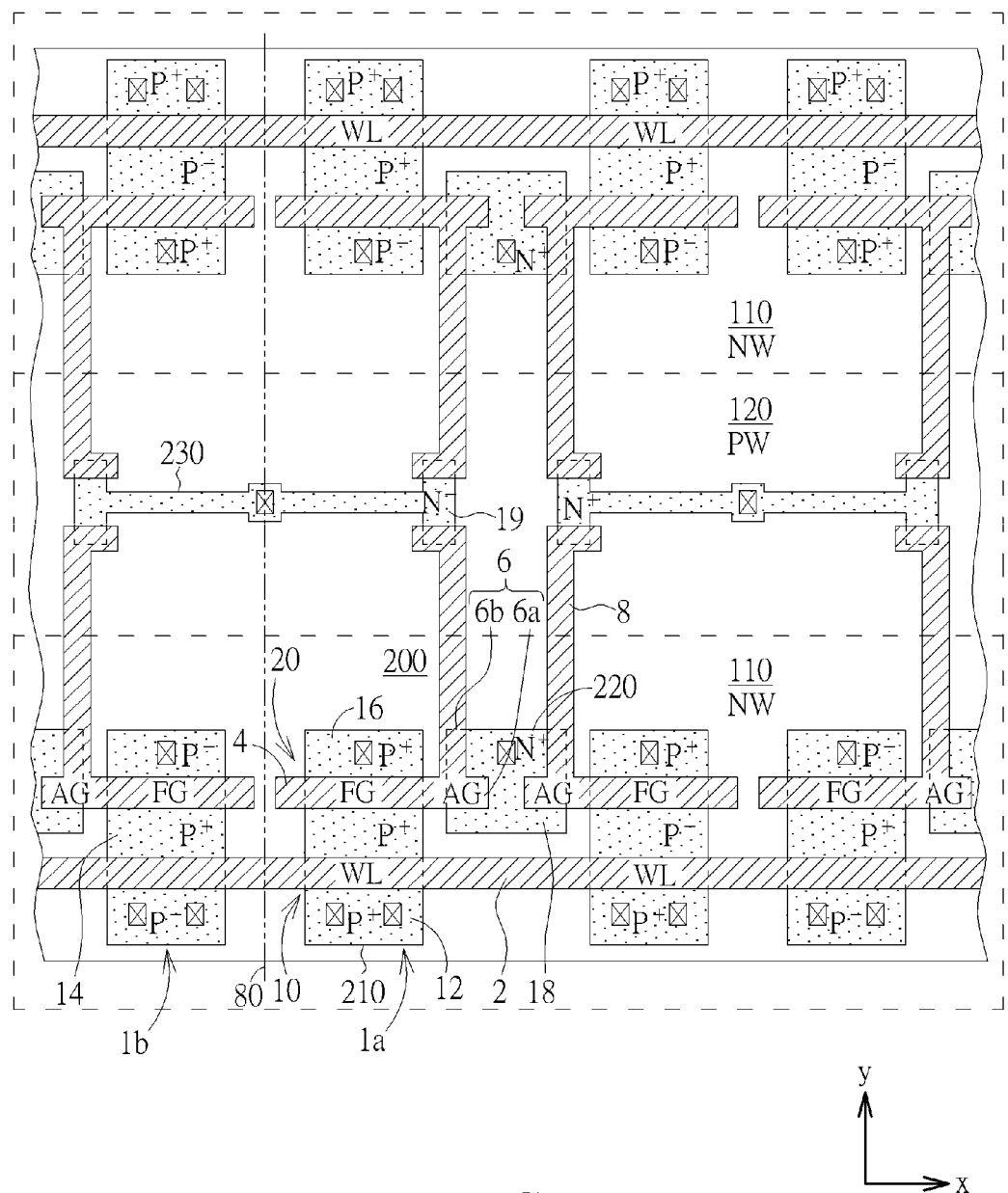
FIG. 7 illustrates a partial layout diagram of a memory array comprising the NVM cell as set forth in FIG. 1.

FIG. 7 illustrates a partial layout diagram of a memory array comprising the NVM cell 1 as set forth in FIG. 1. As shown in FIG. 7, the memory array comprises at least an NVM cell 1a and an NVM cell 1b. The NVM cell 1a has substantially the same structure as that set forth in FIG. 1. The NVM cell 1b has a structure that is mirror symmetric to the NVM cell 1a with respect to the central line 80.

Figure 8:
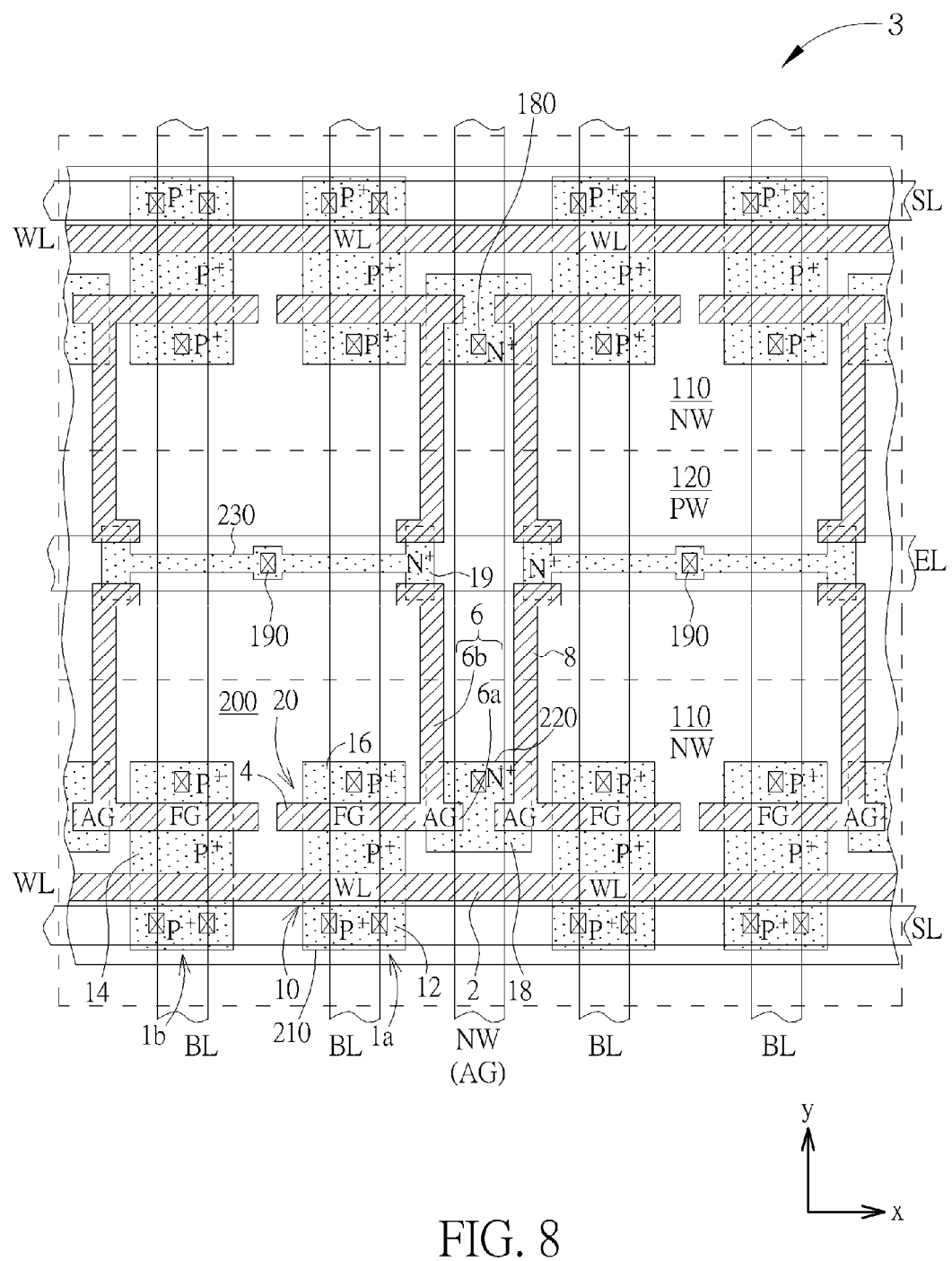
FIG. 8 illustrates a partial layout diagram of a memory array comprising the NVM cell as set forth in FIG. 1, wherein source lines, bit lines, assistance gate line, and erase line are illustrated.
Figure 9:
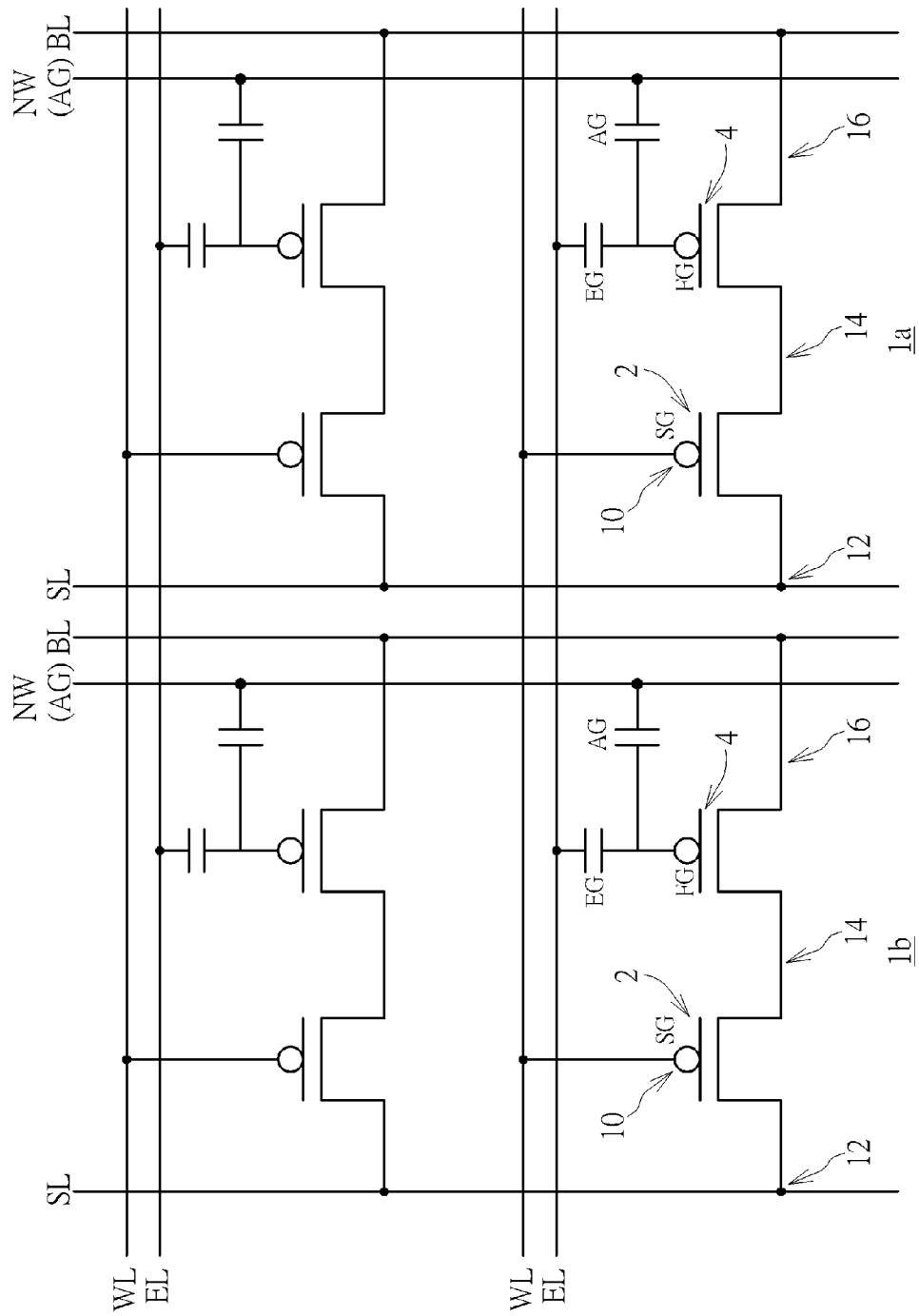
FIG. 9 is an equivalent circuit diagram comprising the memory array as set forth in FIG. 8 according to one embodiment of the invention.

FIG. 8 illustrates a partial layout diagram of a memory array 3 comprising the NVM cells 1a and 1b as set forth in FIG. 7, wherein source lines (SL), bit lines (BL), NW (assistance gate) line, and erase line (EL) are illustrated. FIG. 9 is an equivalent circuit diagram comprising the memory array 3 as set forth in FIG. 8 according to one embodiment of the invention. In FIG. 8, the memory array 3 comprises eight NVM cells. In FIG. 9, only four NVM cells are shown in the equivalent circuit diagram.

As shown in FIG. 8 and FIG. 9, the select gates of the NVM cells in the same row, including, but not limited to the NVM cells 1a and 1b, are electrically connected to the same word line (WL). It is understood that the word lines may be formed integrally with the select gates of the NVM cells. The word lines and the select gates may be formed in the same layer, for example, polysilicon layer. The word lines may extend along the first direction (reference x-axis).

The memory array 3 comprises a plurality of bit lines (BL). The $P^+$ drain doping regions 16 of the NVM cells in the same column are electrically connected to one bit line (BL). The bit lines may extend along the second direction (reference y-axis). It is understood that the bit lines may be formed in the metal interconnect scheme.

A plurality of N well (NW) lines for capacitively coupling an NW voltage to the assistant gates (AG) of the NVM cells is provided in the memory array 3. Only one NW line (or AG line) is illustrated. The NW line may extend along the second direction (reference y-axis) and may be interposed between two bit lines. It is understood that the NW line may be formed in the metal interconnect scheme. The NW line is electrically connected to respective N$^+$ doping regions 18 via N well pick-up contacts 180 on the second OD regions 220 to provide the N well 110 with an N well voltage ($V_{NW}$).

The memory array 3 comprises a plurality of source lines (SL). The P$^+$ source doping regions 12 of the NVM cells in the memory array 3 are electrically connected to respective source lines (SL). In FIG. 7, the source lines (SL) extends along the first direction (reference x-axis). It is understood that the layout of the source lines (SL), bit lines (BL), NW (assistance gate) line, and erase line (EL) in FIG. 7 are for illustration purposes only. The source lines (SL) and the bit lines (BL) may be arranged in different level of the metal interconnect scheme.

A plurality of erase line (EL) for capacitively coupling an erase line voltage ($V_{EL}$) to the assistant gates (AG) of the NVM cells is provided in the memory array 3. Only one erase line is illustrated in this figure for the sake of simplicity. It is understood that the memory array 3 may comprise multiple erase lines. The erase line (EL) may extend along the first direction (reference x-axis). It is understood that the erase line (EL) may be formed in the metal interconnect scheme (e.g. M1 or M2). The erase line (EL) is electrically connected to respective N$^+$ doping regions 19 via contacts 190 on the third OD regions 230 to provide the P well 120 with an erase line voltage $V_{EL}$.

Figure 10:
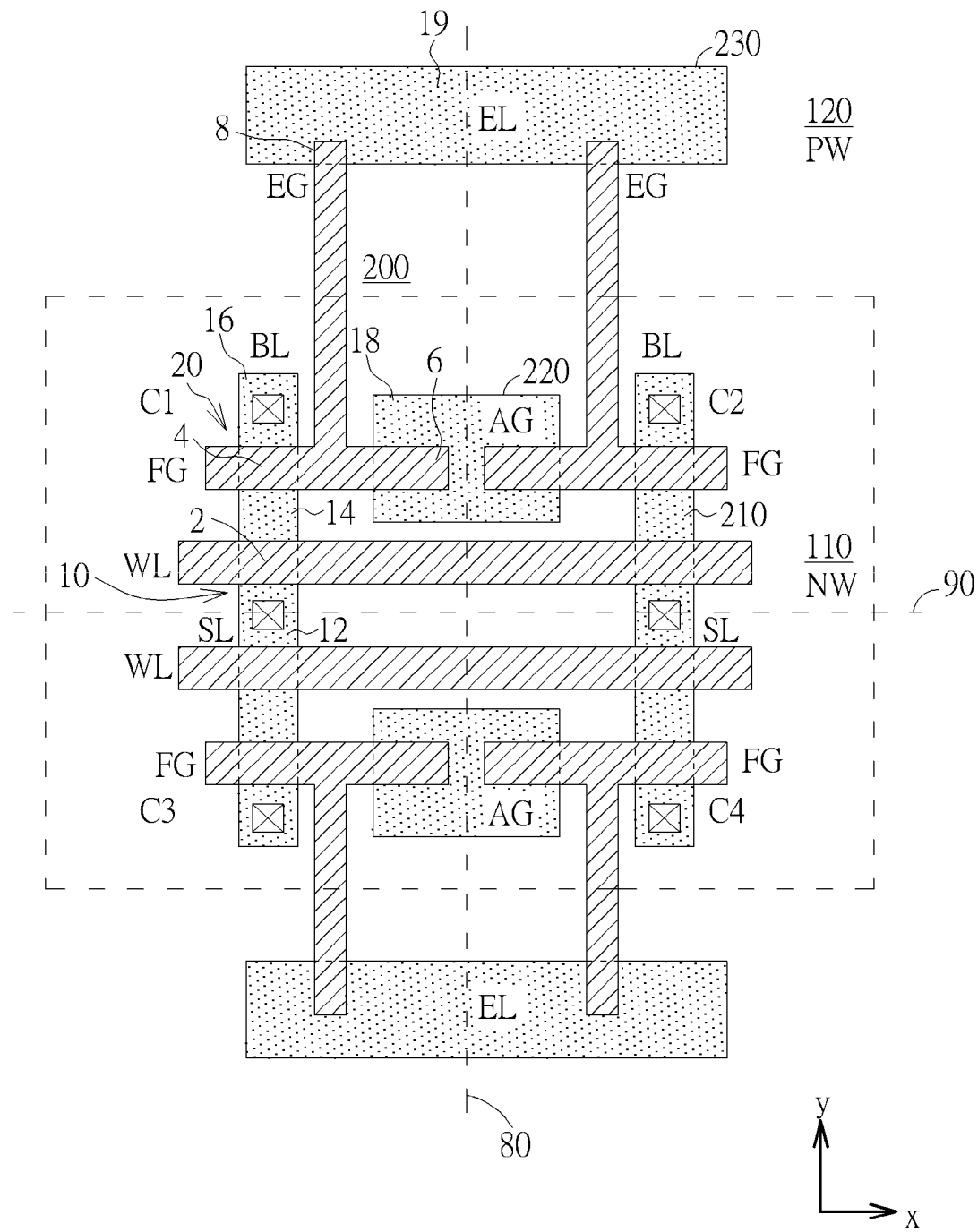
FIG. 10 illustrates an array structure according to another embodiment of the invention.

FIG. 10 illustrates an array structure according to another embodiment of the invention. As shown in FIG. 10, four NVM cells $C_1$, $C_2$, $C_3$, and $C_4$ are illustrated. Each of the four NVM cells $C_1$, $C_2$, $C_3$, and $C_4$ has a similar structure as the NVM cell described through FIG. 1 to FIG. 7.

For example, the NVM cell $C_1$ may comprise three spaced-apart oxide define (OD) regions arranged in close proximity to one another. The three spaced-apart OD regions includes a first OD region 210, a second OD region 220, and a third OD region 230, which are isolated from one another by an isolation region 200 that is embedded in a main surface of a semiconductor substrate 100 such as a P type doped silicon substrate (P-Sub). The second OD region 220 may also be referred to as an assistant gate (AG) coupling area.

According to the illustrative embodiment, the first OD region 210 and the second OD region 220 are formed within an N well (NW) 110, while the third OD region 230 is formed within a P well (PW) 120. In FIG. 10, two first OD regions 210, two second OD regions 220, and two third OD regions 230 are shown. Both of the two first OD regions 210 have a slender, rectangular shape that extends along the second direction (reference y-axis). The two second OD regions 220 are interposed between the two parallel first OD regions 210. Both two third OD regions 230 have a slender, rectangular shape that extends along the first direction (reference x-axis).

The NVM cell $C_1$ comprises a select transistor 10 and a floating gate transistor 20 serially connected to the select transistor 10. The serially connected select transistor 10 and the floating gate transistor 20 may be formed directly on the first OD region 210. The select transistor 10 may be a PMOS transistor and comprises a P$^+$ source doping region 12 (coupled to a source line SL) in the N well 110, a common P$^+$ doping region 14 spaced apart from the P$^+$ source doping region 12, a select gate channel region 32 near the main surface of the semiconductor substrate between the P$^+$ source doping region 12 and the common P$^+$ doping region 14, a select gate (SG) 2 coupled to a word line (WL) overlying the select gate channel region, and a gate dielectric layer between the select gate 2 and the select gate channel region.

The floating gate transistor 20 is formed directly on the first OD region 210. The floating gate transistor 20 is coupled to the select transistor 10 through the common P$^+$ doping region 14. The common P$^+$ doping region 14 is shared by the floating gate transistor 20 and the select transistor 10, thereby forming two serially connected PMOS transistors.

The floating gate transistor 20 comprises a floating gate (FG) 4 overlying the first OD region 210. The floating gate 4 consists of a single layer of polysilicon, for example, N$^+$ doped polysilicon or P$^+$ doped polysilicon. The floating gate transistor 20 serves as the charge storage element of the NVM cell. Both of the select gate 2 and the floating gate 4 are straight line-shaped and extend along the first direction (reference x-axis).

The floating gate transistor 20 further comprises the common P$^+$ doping region 14 on one side of the floating gate (FG) 4, a P$^+$ drain doping region 16 on the other side of the floating gate 4, a floating gate channel region between the common P$^+$ doping region 14 and the P$^+$ drain doping region 16 (coupled to a bit line BL), and a gate dielectric layer between the floating gate 4 and the floating gate channel region.

The NVM cell $C_1$ further comprises an assistant gate (AG) 6 that protrudes from one distal end of the floating gate 4 to one edge of the second OD region 220 such that the assistant gate (AG) 6 is capacitively coupled to the second OD region 220 and the N well 110. When viewed from above, the assistant gate (AG) 6 partially overlaps with the second OD region 220.

An N$^+$ doping region 18 may be formed within an area of the second OD region 220 not covered by the assistant gate (AG) 6. An induced voltage coupled from the assistant gate (AG) 6 is controlled by the N well voltage ($V_{NW}$). The induced voltage generated because of the coupling effect between the assistant gate (AG) 6 and the biased N well will increase more carriers tunneling to the floating gate during the program operation so that the program efficiency of the memory cell is improved. The assistant gate (AG) 6 may be composed of N$^+$ doped polysilicon or P$^+$ doped polysilicon.

The NVM cell $C_1$ further comprise an erase gate (EG) 8 that extends continuously from an edge of the floating gate (FG) 4 along the second direction (reference y-axis) and traverses the junction between the N well 110 and the P well 120. According to the illustrative embodiment, one distal end of the erase gate (EG) 8 overlaps with the third OD region 230 that is formed within the P well 120. By providing such configuration, the erase gate (EG) 8 is capacitively coupled to the third OD region 230 and the P well 120. An N$^+$ doping region 19 may be formed within an area of the third OD region 230 not covered by the erase gate (EG) 8.

The NVM cell $C_1$ has a structure that is mirror symmetric to the NVM cell $C_2$ with respect to the central line (dashed line) 80. The NVM cell $C_3$ has a structure that is mirror symmetric to the NVM cell $C_4$ with respect to the central line (dashed line) 80. Therefore, the AG of the NVM cell $C_1$ and the AG of the NVM cell $C_2$ are capacitively coupled to the same second OD region. The AG of the NVM cell $C_3$ and the AG of the NVM cell $C_4$ are capacitively coupled to the same second OD region.

The NVM cell $C_1$ has a structure that is mirror symmetric to the NVM cell $C_3$ with respect to the horizontal central line (dashed line) 90. The NVM cell $C_2$ has a structure that is mirror symmetric to the NVM cell $C_4$ with respect to the horizontal central line 90. Therefore, the NVM cell $C_1$ and the NVM cell $C_3$ share one P⁺ source doping region (coupled to a source line SL). The NVM cell $C_2$ and the NVM cell $C_4$ share one P⁺ source doping region (coupled to the same source line SL).

Figure 11:
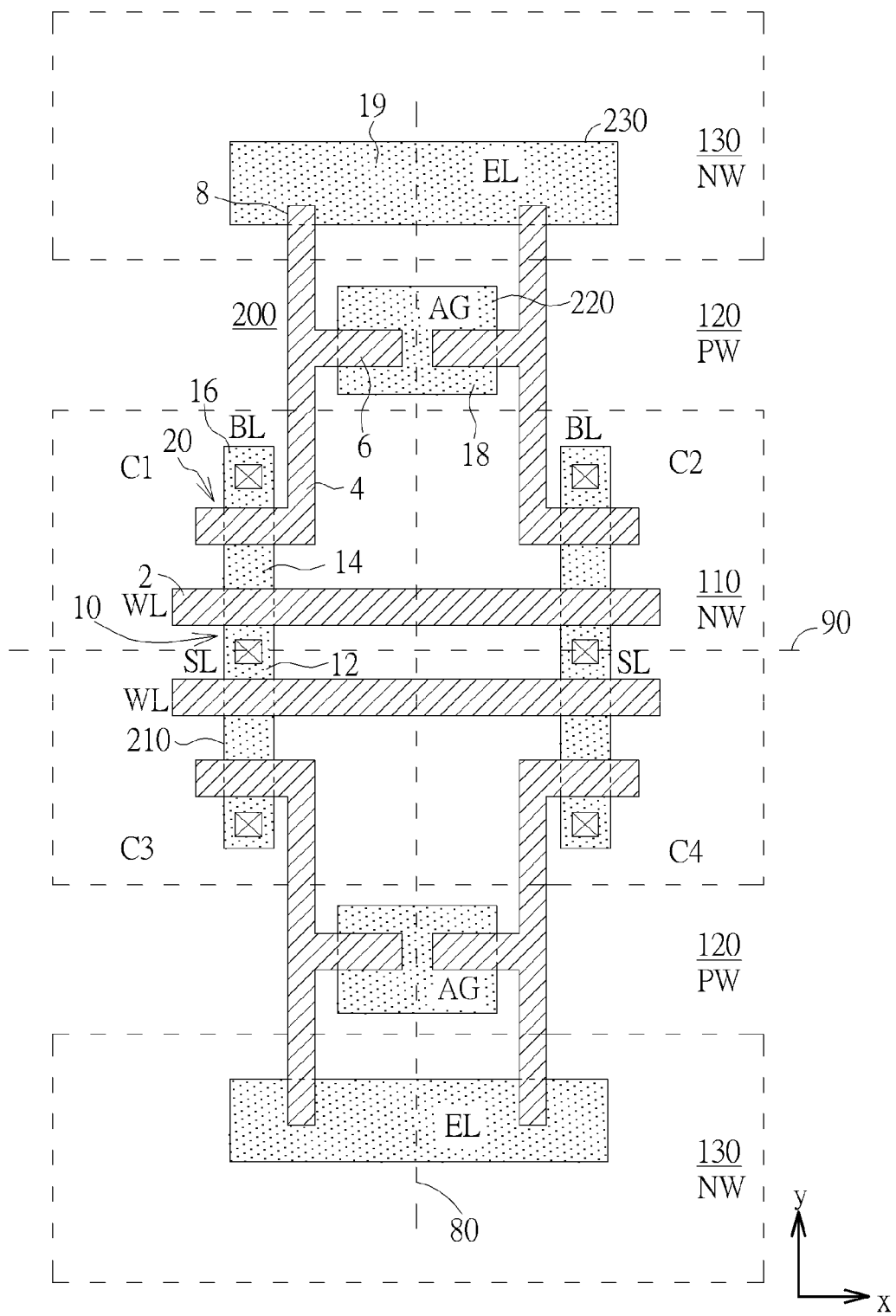
FIG. 11 illustrates an array structure according to still another embodiment of the invention, wherein the second OD region is located outside the N well.

FIG. 11 illustrates an array structure according to still another embodiment of the invention. As shown in FIG. 11, four NVM cells $C_1$, $C_2$, $C_3$, and $C_4$ are illustrated. The NVM cell has similar structure as the NVM cell described in FIG. 10 except that the second OD region 220 is located outside the N well 110 and the third OD region is located within the N well 130. The second OD region 220 is located within the P well 120 between the N well 110 and the N well 130.

For example, the NVM cell $C_1$ comprises a select transistor 10 and a floating gate transistor 20 serially connected to the select transistor 10. The serially connected select transistor 10 and the floating gate transistor 20 may be formed directly on the first OD region 210. The select transistor 10 may be a PMOS transistor and comprises a P⁺ source doping region 12 (coupled to a source line SL) in the N well 110, a common P⁺ doping region 14 spaced apart from the P⁺ source doping region 12, a select gate channel region near the main surface of the semiconductor substrate between the P⁺ source doping region 12 and the common P⁺ doping region 14, a select gate (SG) 2 coupled to a word line (WL) overlying the select gate channel region, and a gate dielectric layer between the select gate 2 and the select gate channel region.

The floating gate transistor 20 is formed directly on the first OD region 210. The floating gate transistor 20 is coupled to the select transistor 10 through the common P⁺ doping region 14. The common P⁺ doping region 14 is shared by the floating gate transistor 20 and the select transistor 10, thereby forming two serially connected PMOS transistors.

The floating gate transistor 20 comprises a floating gate (FG) 4 overlying the first OD region 210. The floating gate 4 consists of a single layer of polysilicon, for example, N⁺ doped polysilicon or P⁺ doped polysilicon. The floating gate transistor 20 serves as the charge storage element of the NVM cell. Both of the select gate 2 and the floating gate 4 are straight line-shaped and extend along the first direction (reference x-axis).

The floating gate transistor 20 further comprises the common P⁺ doping region 14, a P⁺ drain doping region 16 on the other side of the floating gate 4, a floating gate channel region between the common P⁺ doping region 14 and the P⁺ drain doping region 16 (coupled to a bit line BL), and a gate dielectric layer between the floating gate 4 and the floating gate channel region. An assistant gate (AG) 6 protrudes from the floating gate 4 to one edge of the second OD region 220 such that the assistant gate (AG) 6 is capacitively coupled to the second OD region 220 in the P well 120. When viewed from above, the assistant gate (AG) 6 partially overlaps with the second OD region 220. A doping region 18 may be formed within an area of the second OD region 220 not covered by the assistant gate (AG) 6.

The NVM cell $C_1$ further comprise an erase gate (EG) 8 that extends continuously from the floating gate (FG) 4 along the second direction (reference y-axis) and traverses the junction between the N well 130 and the P well 120. One distal end of the erase gate (EG) 8 overlaps with the third OD region 230 that is formed within the N well 130. By providing such configuration, the erase gate (EG) 8 is capacitively coupled to the third OD region 230. A doping region 19 may be formed within an area of the third OD region 230 not covered by the erase gate (EG) 8.

The NVM cell $C_1$ has a structure that is mirror symmetric to the NVM cell $C_2$ with respect to the central line (dashed line) 80. The NVM cell $C_3$ has a structure that is mirror symmetric to the NVM cell $C_4$ with respect to the central line 80. Therefore, the AG of the NVM cell $C_1$ and the AG of the NVM cell $C_2$ are capacitively coupled to the same second OD region. The AG of the NVM cell $C_3$ and the AG of the NVM cell $C_4$ are capacitively coupled to the same second OD region.

The NVM cell $C_1$ has a structure that is mirror symmetric to the NVM cell $C_3$ with respect to the horizontal central line (dashed line) 90. The NVM cell $C_2$ has a structure that is mirror symmetric to the NVM cell $C_4$ with respect to the horizontal central line 90. Therefore, the NVM cell $C_1$ and the NVM cell $C_3$ share one P⁺ source doping region (coupled to a source line SL). The NVM cell $C_2$ and the NVM cell $C_4$ share one P⁺ source doping region (coupled to the same source line SL).

Figure 12:
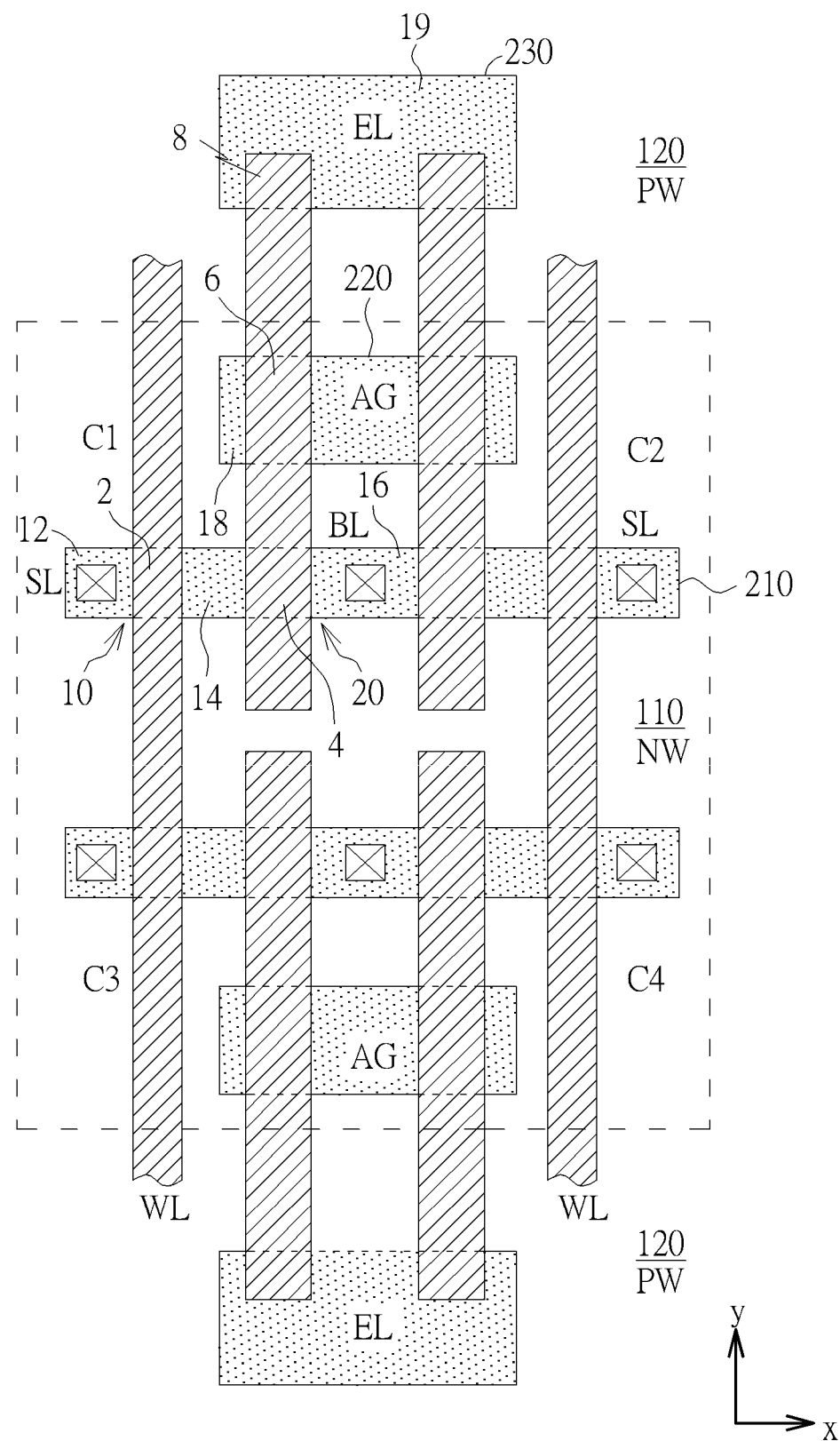
FIG. 12 illustrates an array structure according to still another embodiment of the invention, wherein the FG, AG and EG are aligned along the second direction.

FIG. 12 illustrates an array structure according to still another embodiment of the invention. As shown in FIG. 12, four NVM cells $C_1$, $C_2$, $C_3$, and $C_4$ are illustrated. The FG, AG and EG are aligned along the second direction. In FIG. 12, two first OD regions 210, two second OD regions 220, and two third OD regions 230 are shown. Both of the two first OD regions 210 have a slender, rectangular shape that extends along the first direction (reference x-axis). The two third OD regions 230 may have a rectangular shape. The second OD region 220 is interposed between the first OD regions 210 and the third OD region 230.

For example, the NVM cell $C_1$ comprises a select transistor 10 and a floating gate transistor 20 serially connected to the select transistor 10. The serially connected select transistor 10 and the floating gate transistor 20 may be formed directly on the first OD region 210. The select transistor 10 may be a PMOS transistor and comprises a P⁺ source doping region 12 (coupled to a source line SL) in the N well 110, a common P⁺ doping region 14 spaced apart from the P⁺ source doping region 12, a select gate channel region near the main surface of the semiconductor substrate between the P⁺ source doping region 12 and the common P⁺ doping region 14, a select gate (SG) 2 connected to a word line (WL) overlying the select gate channel region, and a gate dielectric layer between the select gate 2 and the select gate channel region.

The floating gate transistor 20 is formed directly on the first OD region 210. The floating gate transistor 20 is coupled to the select transistor 10 through the common P⁺ doping region 14. The common P⁺ doping region 14 is shared by the floating gate transistor 20 and the select transistor 10, thereby forming two serially connected PMOS transistors.

The floating gate transistor 20 comprises a floating gate (FG) 4 overlying the first OD region 210. The floating gate 4 consists of a single layer of polysilicon, for example, N⁺ doped polysilicon or P⁺ doped polysilicon. The floating gate transistor 20 serves as the charge storage element of the NVM cell. Both of the select gate 2 and the floating gate 4 are straight line-shaped and extend along the first direction (reference x-axis).

The floating gate transistor 20 further comprises the common P⁺ doping region 14, a P⁺ drain doping region 16 on the other side of the floating gate 4, a floating gate channel region between the common P⁺ doping region 14 and the P⁺ drain doping region 16 (coupled to a bit line BL), and a gate dielectric layer between the floating gate 4 and the floating gate channel region. An assistant gate (AG) 6 protrudes from the floating gate 4 to overlap with the second OD region 220 such that the assistant gate (AG) 6 is capacitively coupled to the second OD region 220. A doping region 18 may be formed within an area of the second OD region 220 not covered by the assistant gate (AG) 6.

The NVM cell $C_1$ further comprise an erase gate (EG) 8 that extends continuously from the floating gate (FG) 4 along the second direction (reference y-axis) and traverses the junction between the N well 110 and the P well 120. One distal end of the erase gate (EG) 8 overlaps with the third OD region 230 that is formed within the N well 130. By providing such configuration, the erase gate (EG) 8 is capacitively coupled to the third OD region 230. A doping region 19 may be formed within an area of the third OD region 230 not covered by the erase gate (EG) 8.

Figure 13:
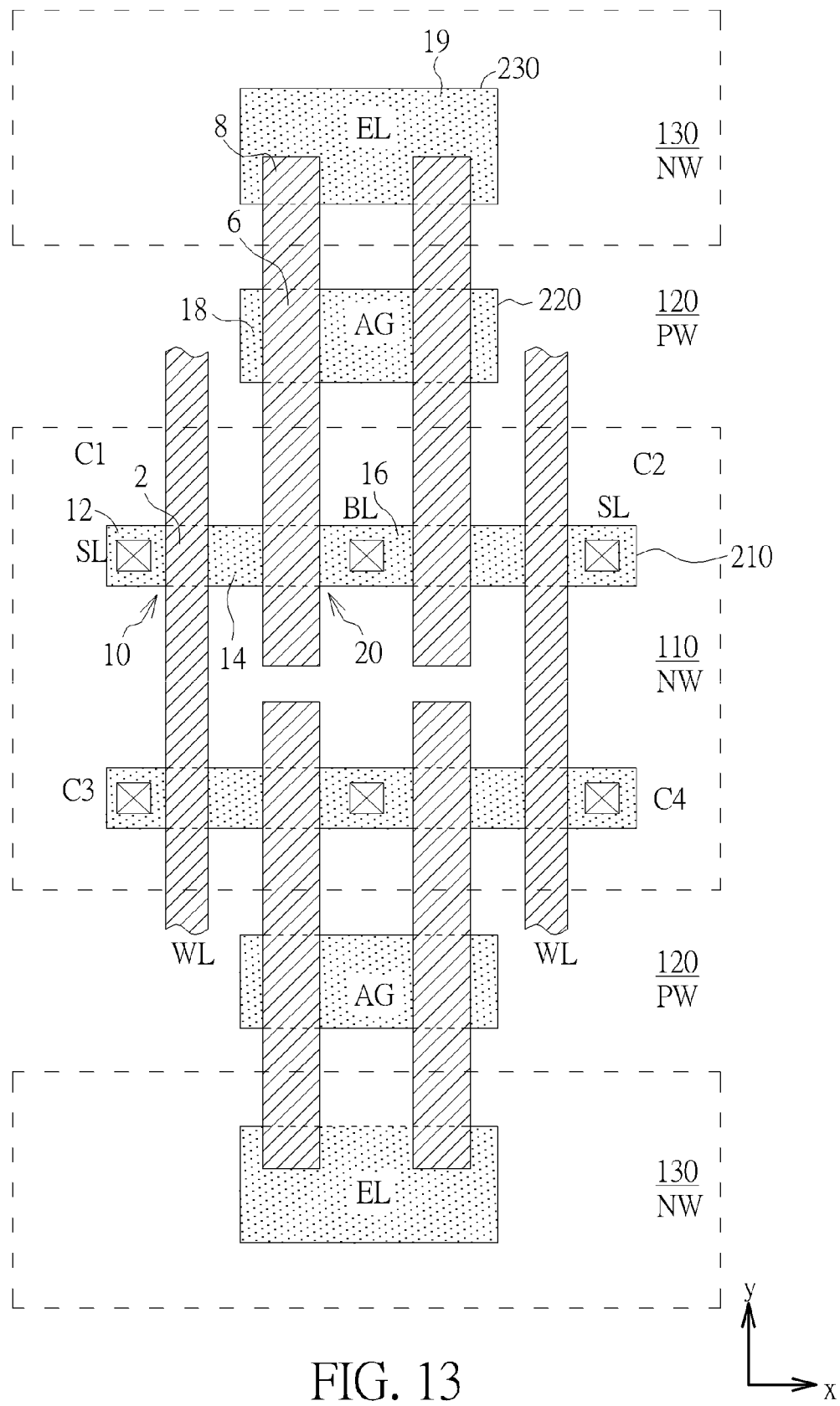
FIG. 13 illustrates an array structure according to still another embodiment of the invention, wherein the FG, AG and EG are aligned along the second direction, and wherein the second OD region is located outside the N well.

FIG. 13 illustrates an array structure according to still another embodiment of the invention. As shown in FIG. 13, four NVM cells $C_1$, $C_2$, $C_3$, and $C_4$ are illustrated. The NVM cell has similar structure as the NVM cell described in FIG. 12, except that the second OD region 220 is located outside the N well 110 and the third OD region 230 is located within the N well 130. The second OD region 220 is located within the P well 120. The P well 120 is interposed between the N well 110 and the N well 130.

Figure 14:
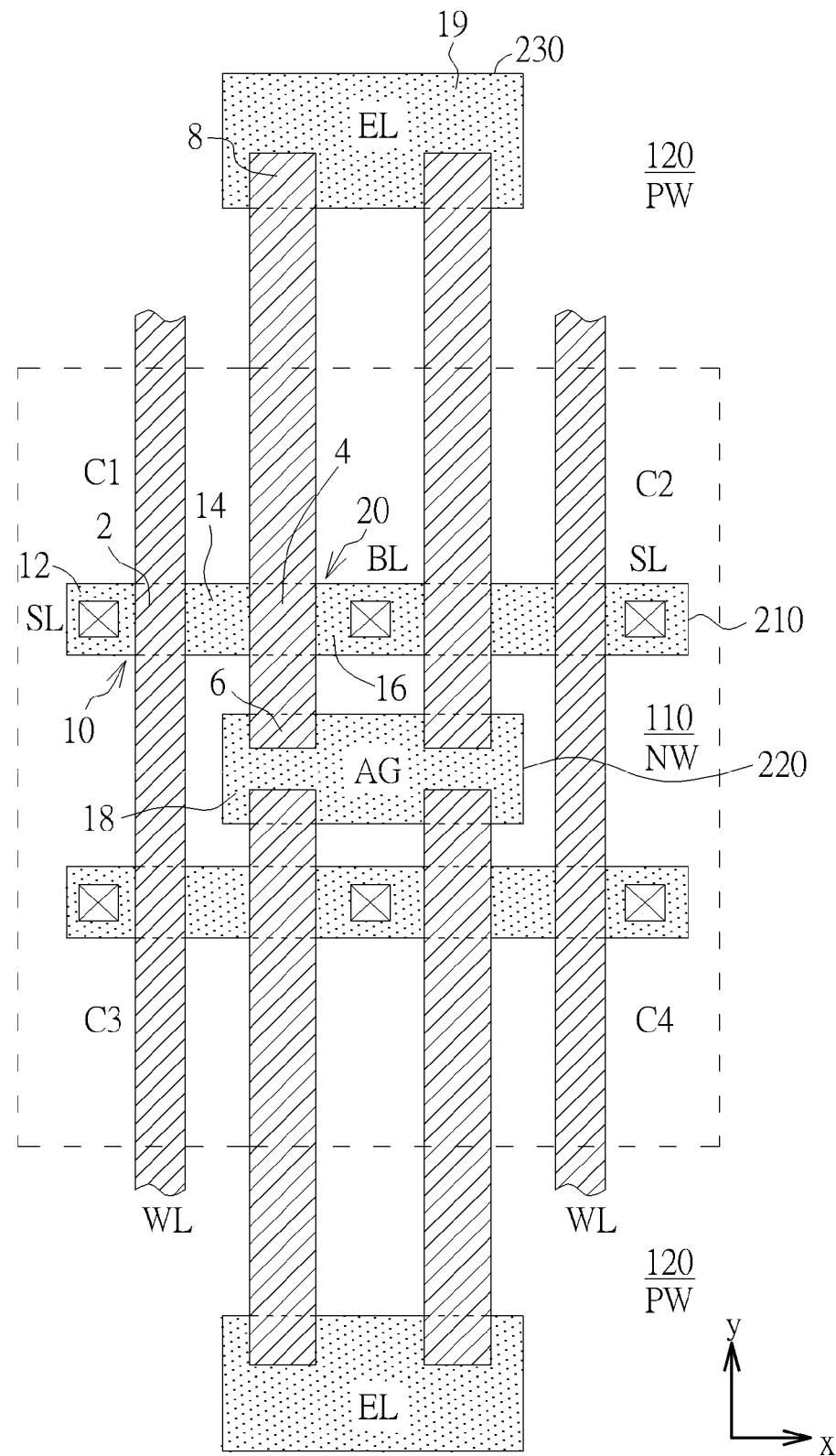
FIG. 14 illustrates an array structure according to still another embodiment of the invention, wherein the four NVM cells share one AG coupling area (second OD region).

FIG. 14 illustrates an array structure according to still another embodiment of the invention. As shown in FIG. 14, four NVM cells $C_1$, $C_2$, $C_3$, and $C_4$ are illustrated. The NVM cell has similar structure as the NVM cell described in FIG. 12, except that the four NVM cells $C_1$, $C_2$, $C_3$, and $C_4$ commonly share one AG coupling area (second OD region 220). The second OD region 220 is interposed between the two parallel first OD regions 210 to provide a more compact array structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory (NVM) array, comprising:
  a plurality of NVM cells, wherein each of the NVM cells comprises:
    a semiconductor substrate having therein a first N well;
    a first oxide define (OD) region and a second oxide define (OD) region disposed within the semiconductor substrate;
    a PMOS select transistor disposed on the first OD region, wherein the PMOS select transistor comprises a select gate, a first $P^+$ source doping region in the first N well, and a second $P^+$ doping region spaced apart from the first $P^+$ source doping region;
    a PMOS floating gate transistor serially connected to the PMOS select transistor and being disposed over the first OD region, wherein the PMOS floating gate transistor comprises a floating gate overlying the first OD region, the second $P^+$ doping region, and a third $P^+$ doping region spaced apart from the second $P^+$ source doping region, wherein the PMOS floating gate transistor serves as a charge storage element of the NVM cell;
    an assistant gate protruding from the floating gate to one edge of the second OD region such that the assistant gate is capacitively coupled to the second OD region, wherein the assistant gate is formed integrally with the floating gate using a single layer of polysilicon;
  a plurality of word lines extending along a first direction, wherein each of the word lines is electrically connected to the select gate of the PMOS select transistor of each of the plurality of NVM cells;
  a plurality of bit lines extending along a second direction, wherein each of the bit lines is electrically connected to the third $P^+$ doping region of the PMOS floating gate transistor of each of the plurality of NVM cells; and
  a plurality of source lines, wherein each of the source lines is electrically connected to the first $P^+$ doping region of the PMOS select transistor of each of the plurality of NVM cells.

2. The NVM array according to claim 1, wherein the first OD region and the second OD region are disposed within the first N well.

3. The NVM array according to claim 1, wherein an induced voltage coupled from the assistant gate is controlled by a bias of the first N well.

4. The NVM array according to claim 1, wherein the first direction is perpendicular to the second direction.

5. The NVM array according to claim 1, further comprising a P well and a third oxide define (OD) region within the semiconductor substrate.

6. The NVM array according to claim 5, further comprising an erase gate extending continuously from the floating gate and traversing a junction between the first N well and the P well.

7. The NVM array according to claim 6, wherein one distal end of the erase gate overlaps with the third OD region such that the erase gate is capacitively coupled to the third OD region.

8. The NVM array according to claim 5, wherein the first OD region is disposed within the first N well, and the second OD region is disposed within the P well.

9. The NVM array according to claim 8, further comprising a second N well, wherein third OD region is disposed within the second N well.

10. The NVM array according to claim 5, wherein the first OD region and the second OD region are disposed within the first N well, and the third OD region is disposed within the P well.

11. The NVM array according to claim 5, further comprising a plurality of erase lines for capacitively coupling an erase line voltage to the assistant gate of each of the plurality of NVM cells.

12. The NVM array according to claim 11, wherein the erase lines extend along the first direction.

13. The NVM array according to claim 11, wherein each of the erase lines is electrically connected to a doped region in the third OD region.

14. The NVM array according to claim 11, wherein the erase lines, the bit lines, the source lines are formed in a metal interconnect scheme.

* * * * *